US006849959B2

(12) United States Patent
Inomata (10) Patent No.: US 6,849,959 B2
(45) Date of Patent: Feb. 1, 2005

(54) METHOD OF FABRICATING SEMICONDUCTOR DEVICE

(75) Inventor: Daisuke Inomata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 106 days.

(21) Appl. No.: 10/630,770

(22) Filed: Jul. 31, 2003

(65) Prior Publication Data

US 2004/0075109 A1 Apr. 22, 2004

Related U.S. Application Data

(62) Division of application No. 10/252,399, filed on Sep. 24, 2002, now Pat. No. 6,635,529.

(30) Foreign Application Priority Data

Mar. 15, 2002 (JP) ........................................ 2002/071909

(51) Int. Cl.$^7$ ........................................... H01L 27/108
(52) U.S. Cl. ...................................... 257/906; 257/296
(58) Field of Search ........................... 257/68, 296, 905, 257/906

(56) References Cited

U.S. PATENT DOCUMENTS 6,211,096 B1    4/2001    Allman et al. .............. 438/787
6,346,741 B1    2/2002    Van Buskirk et al. ...... 257/664
6,635,529 B2 *  10/2003   Inomata ...................... 438/253

FOREIGN PATENT DOCUMENTS

| JP | 07-111318   | 4/1995 |
| JP | 08-037282   | 2/1996 |
| JP | 2001-060669 | 3/2001 |
| JP | 2001-217397 | 8/2001 |
| JP | 2002-176149 | 6/2002 |

* cited by examiner

Primary Examiner—David Nhu
(74) Attorney, Agent, or Firm—Volentine Francos, PLLC (57) ABSTRACT

A method of fabricating a semiconductor device according to the invention comprises forming a capacitor comprising a lower electrode formed on a semiconductor substrate, a capacitive insulator made up of a metal oxide film, formed on the lower electrode, and an upper electrode formed on the capacitive insulator; forming a metal pattern to be electrically connected to the electrodes of the capacitor; forming a first protection film which coats at least a side face of the metal pattern; and forming a water constituents diffusion preventive film on the side face and top face of the metal pattern through the intermediary of the first protection film. As a result, a method of fabricating a ferroelectric memory capable of protecting a ferroelectric capacitor from water constituents evolved during a fabrication process, and maintaining satisfactory memory characteristics can be provided.

17 Claims, 5 Drawing Sheets

METHOD OF FABRICATING SEMICONDUCTOR DEVICE

CROSS-REFERENCE TO RELATED APPLICATIONS

This claims priority to and is a divisional of Ser. No. 10/252,399, filed Sep. 24, 2002, now U.S. Pat. No. 6,635,529, the contents of which are incorporated herein by reference.

BACKGROUND OF THE INVENTION

1. Field of the Invention

The present invention relates to a semiconductor device and a method of fabricating the same, and in particular, to a semiconductor device comprising a ferroelectric memory employing a highly ferroelectric film as a capacitive insulator and a method of fabricating the same.

2. Description of the Related Art

In recent years, attention has been focused on a semiconductor memory called a FeRAM (Ferroelectric Random Access Memory) comprising a capacitor that employs a ferroelectric film for a capacitive insulator, as the coming generation of a nonvolatile memory.

With a conventional ferroelectric memory, a ferroelectric capacitor comprising a capacitive insulator made up of a ferroelectric film, and an upper electrode and a lower electrode with the capacitive insulator interposed between the electrodes is formed on a semiconductor substrate with an integrated circuit comprising transistors and so froth, formed thereon.

Further, a silicon oxide film serving as an interlayer insulator is formed on top of the semiconductor substrate and the ferroelectric capacitor, and after removal of water constituents contained in the interlayer insulator by heat treatment, contact holes reaching the integrated circuit or the ferroelectric capacitor, provided on the semiconductor substrate, are formed in the interlayer insulator.

A metal pattern made of material such as aluminum (Al), titanium (Ti), or tungsten (W), and so forth is formed inside these contact holes, and is electrically connected to the integrated circuit and the ferroelectric capacitor, respectively. Further, a passivation film serving as a protection film is formed on the respective metal patterns.

With a capacitor making up a conventional FeRAM, an insulating film made of a metal oxide such as strontium bismuth tantalate ($SrBi_2Ta_2O_9$) called as SBT, lead zirconate titanate ($Pb(Zr, Ti)O_3$) called as PZT, and so forth is used for a capacitive insulator made up of a ferroelectric film.

Further, a noble metal is generally used as the constituent material of the upper electrode and lower electrode. This is because at the time of forming a highly ferroelectric film, and at the time of improving the film quality of the capacitive insulator after the formation of the capacitor, the electrodes making up the capacitor come to be exposed to a high temperature oxidizing atmosphere, so that oxidation resistance is highly required of the constituent material of the electrodes. Particularly, in the case of the conventional ferroelectric capacitor, platinum (Pt) is used as a constituent material of the electrodes from the viewpoint of cost, process stability, ease in the fabrication of the ferroelectric film, and excellent workability.

SUMMARY OF THE INVENTION

In developing the present invention relating to a semiconductor device comprising a ferroelectric capacitor, particularly using a noble metal having a catalytic action as a constituent material of electrodes, attention has been focused on hydrogen molecules evolved due to oxidation of the surface of metal patterns made of Al, Ti, W, or so forth in the course of water constituents such as constitution water, contained in a silicon oxide film making up interlayer insulators, adsorption water evolved in a cleaning process, and so forth undergoing thermal diffusion following heat treatment applied in later stages.

It is therefore an object of the invention to provide a method of fabricating a semiconductor device comprising a ferroelectric memory maintaining satisfactory memory characteristics by decreasing evolution of the hydrogen molecules, and suppressing evolution of hydrogen atoms that cause metal oxides of a ferroelectric film, produced by the agency of the catalytic action of the constituent material of the electrodes, to undergo reduction. Further, it is another object of the invention to provide a method of fabricating a semiconductor device capable of protecting a ferroelectric capacitor from water constituents evolved in fabrication steps after the formation of the ferroelectric capacitor.

In accordance with a first aspect of the invention, there is provided a method of fabricating a semiconductor device comprising:

a step of forming a capacitor comprising a lower electrode formed on a semiconductor substrate, a capacitive insulator made up of a metal oxide film, formed on the lower electrode, and an upper electrode formed on the capacitive insulator;

a step of forming a metal pattern to be electrically connected to the electrodes of the capacitor;

a step of forming a first protection film for coating at least a side face of the metal pattern; and a step of forming a water constituents diffusion preventive film on the side face and top face of the metal pattern through the intermediary of the first protection film.

Further, in accordance with a second aspect of the invention, there is provided a method of fabricating a semiconductor device comprising:

a step of forming a capacitor comprising a lower electrode formed on a semiconductor substrate, a capacitive insulator made up of a metal oxide film, formed on the lower electrode, and an upper electrode formed on the capacitive insulator;

a step of forming an interlayer insulator on top of the capacitor and the semiconductor substrate;

a step of forming a hole in the interlayer insulator for exposing the top face of the electrodes of the capacitor;

a step of forming a metal pattern inside the hole for electrical connection with the electrodes of the capacitor;

a step of forming an insulating film having a low water constituent content on top of the metal patter inside the hole; and a step of forming a water constituents diffusion preventive film on top of the metal pattern or the insulating film having the low water constituent content.

Thus, the invention can provide the method of fabricating the semiconductor device comprising the ferroelectric capacitor using a noble metal having a catalytic action as the constituent material of the electrodes, wherein evolution of hydrogen atoms, caused by the catalytic action of the constituent material of the electrodes, can be suppressed, so that the ferroelectric memory of the semiconductor device is capable of maintaining satisfactory memory characteristics.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the invention are described in detail hereinafter with reference to the accompanying drawings. First, a first embodiment of the invention is described.

Figure 1:
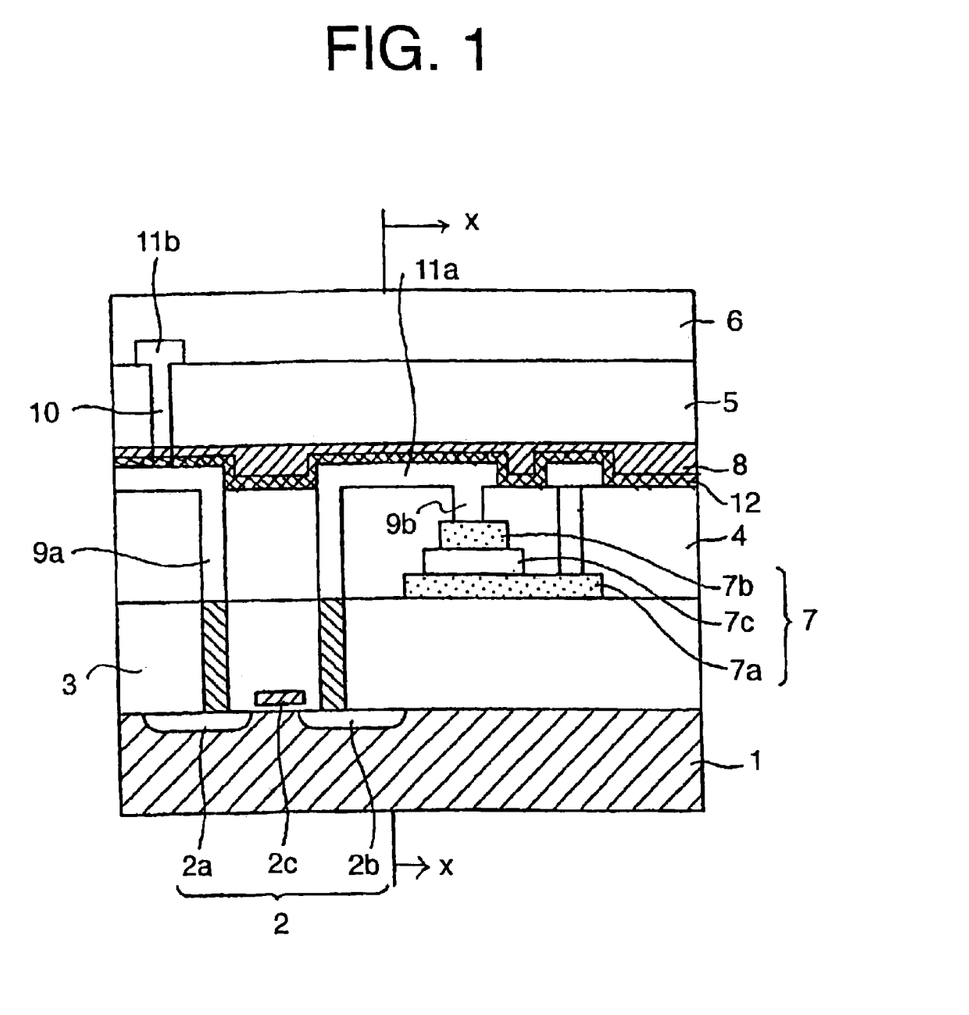
FIG. 1 is a sectional view of a semiconductor device fabricated according to a first embodiment of the invention.
Figure 2A:
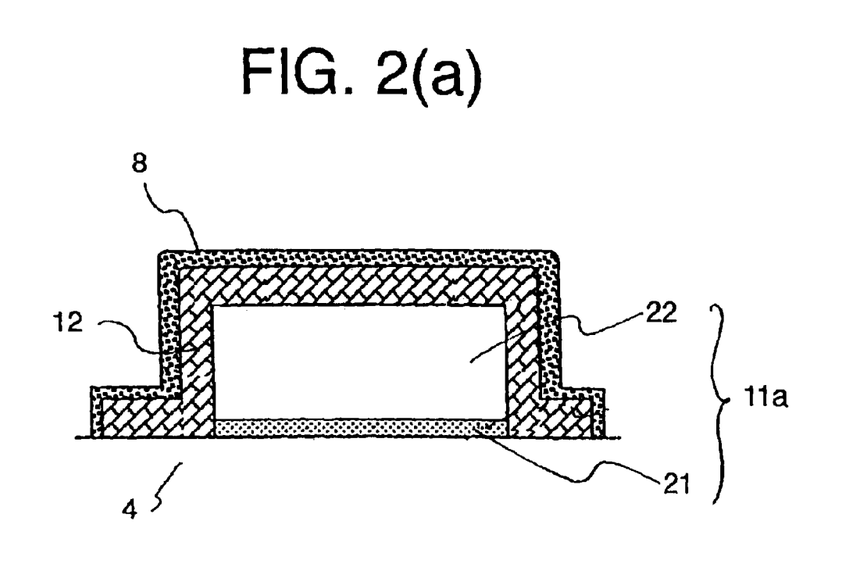
FIG. 2 is an expanded view of a metal pattern of the semiconductor device fabricated according to the first embodiment of the invention.
Figure 2B:
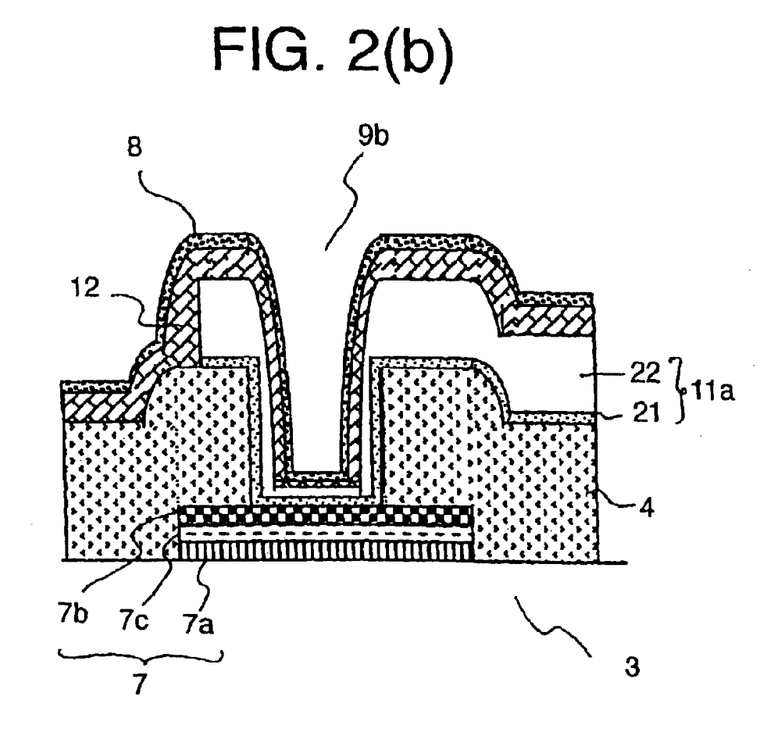
Figure 3A:
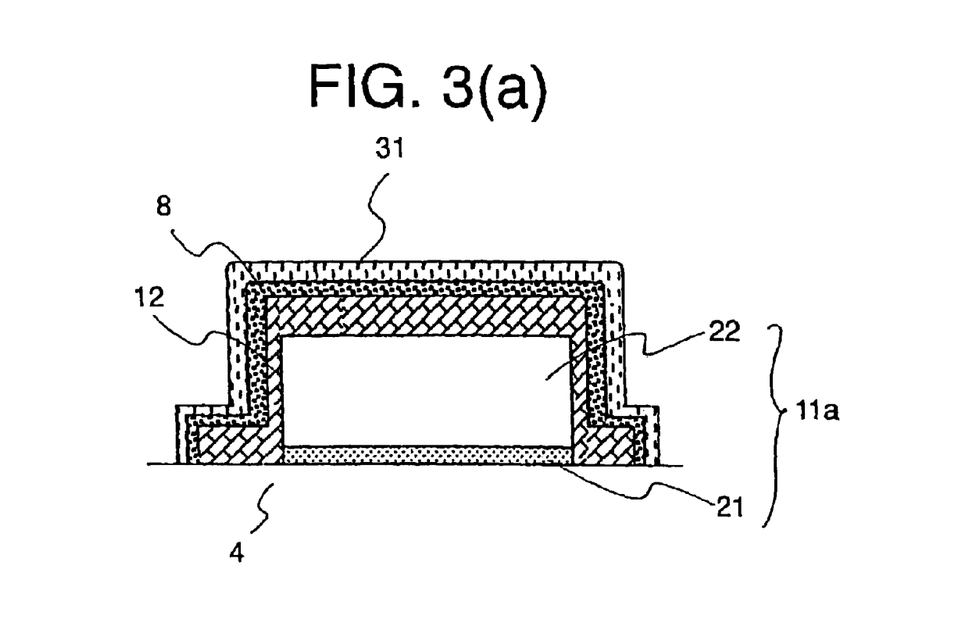
FIG. 3 is an expanded view of a first variation of the metal pattern of the semiconductor device fabricated according to the first embodiment of the invention.
Figure 3B:
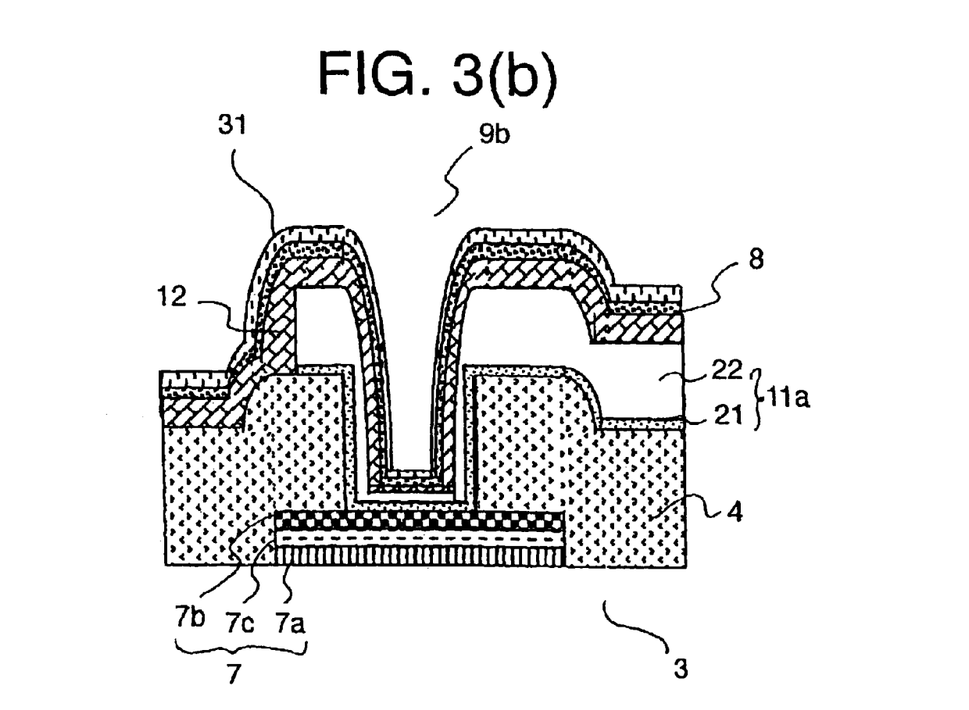
Figure 4A:
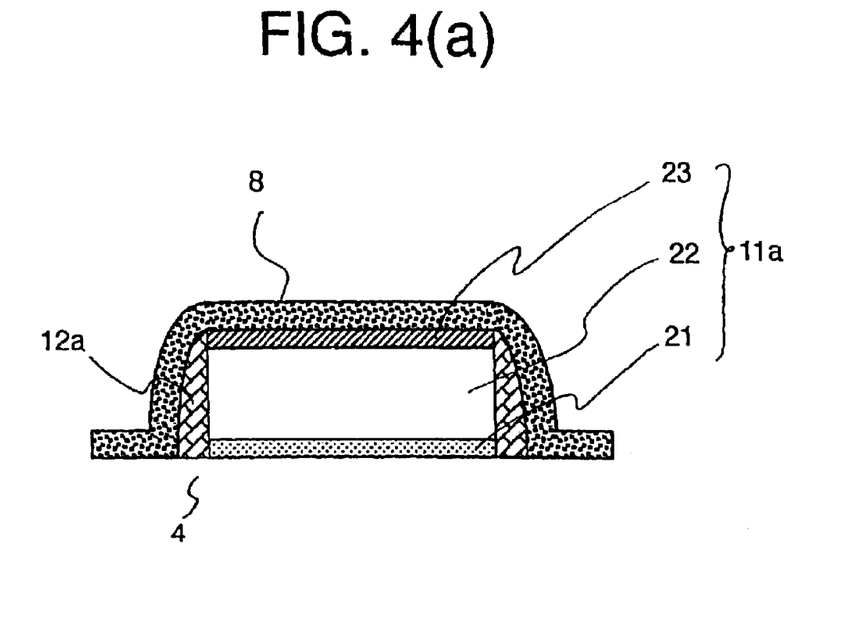
FIG. 4 is an expanded view of a second variation of the metal pattern of the semiconductor device fabricated according to the first embodiment of the invention.
Figure 4B:
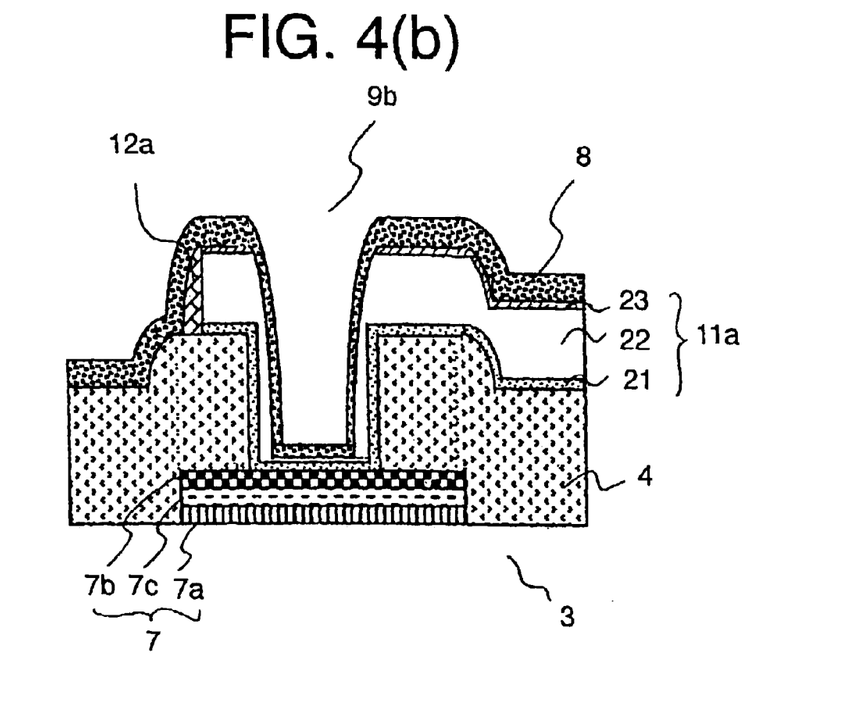

FIG. 1 is a sectional view showing a semiconductor device fabricated according to the first embodiment of the invention, and FIGS. 2 to 4 are expanded views showing a metal pattern in FIG. 1, as expanded.

As shown in FIG. 1, a ferroelectric memory according to the invention comprises a semiconductor substrate 1, a transistor 2 comprised of a source region 2a and a drain region 2b, formed on a surface of the semiconductor substrate 1, and a gate electrode 2c formed on the semiconductor substrate 1 between the source region 2a and the drain region 2b, and a first interlayer insulator 3, a second interlayer insulator 4, a third interlayer insulator 5, and a passivation film 6 that are formed in that order on top of the semiconductor substrate switch 1.

Further, on top of the first interlayer insulator 3, there is provided a ferroelectric capacitor 7 comprising a lower electrode 7a and an upper electrode 7b, made of material having a catalytic action, such as, for example, platinum (Pt), and a ferroelectric film 7c made up of a metal oxide film such as PZT, SBT, and so forth.

There are provided a contact hole 9a reaching the semiconductor substrate 1 in the first interlayer insulator 3 and the second interlayer insulator 4, and a contact hole 9b reaching the upper and lower electrodes 7a, 7b of the ferroelectric capacitor 7 in the second interlayer insulator 4, respectively. And inside the contact holes 9a, 9b, there is formed a first metal pattern 11a to be electrically connected with the transistor 2 and the ferroelectric capacitor 7, respectively.

Further, with the semiconductor device shown in FIG. 1, according to the first embodiment, a through hole 10 reaching the first metal pattern 11a is provided in the third interlayer insulator 5, and inside the through hole 10, a second metal pattern 11b to be electrically connected with the first metal pattern 11a is formed. That is, the semiconductor device fabricated according to the present embodiment has a multilayered structure wherein a plurality of the first metal patterns 11a and the second metal patterns 11b are stacked.

On at least the side face of the first metal pattern 11a, there is formed a first protection film 12 having capability of preventing diffusion of water constituents and high coating power, thereby covering the side face of the first metal pattern 11a. With the semiconductor device according to the present embodiment, shown in FIG. 2(a), the first protection film 12 is formed to a substantially identical thickness on both the top face and the side face of the first metal pattern 11a. For the first protection film 12, use is preferably made of a film not containing water constituents and evolving no hydrogen during the formation of the film, such as a metal oxide film with a passivated surface. Further, the first protection film 12 preferably is a film more insusceptible to oxidation than the constituent material of the first metal pattern 11a, such as, for example, aluminum (Al), titanium (Ti) and tungsten (W).

In addition, in the case of the present embodiment, since the first protection film 12 is formed so as to span an interval between the first metal patterns 11a adjacent to each other, the film for use as the first protection film 12 is preferably a film having electric resistivity to such an extent that problems such as cross talk and short circuit between the metal patterns are not caused to occur, that is, a highly insulating film having electric resistivity in the order of not less than $1 \times 10^{10} \Omega.m$.

Examples of the first protection film 12 include films, such as a titanium oxide (TiO) film, an aluminum oxide ($Al_2O_3$) film, and so forth, formed by the well-known chemical vapor deposition (CVD) method, and so forth.

In this connection, when comparing the TiO film with the $Al_2O_3$ film as films for use as the first protection film 12, use of the $Al_2O_3$ film having lower stabilizing energy, after bonding with oxygen, for the first protection film 12 will enable prevention of oxidation of the first metal pattern 11a with greater certainty in comparison with the case of using the TiO film.

Now, the first metal pattern 11a according to the invention is described in detail hereinafter by referring to FIGS. 2 to 4 which are expanded views showing principal parts of the first metal pattern 11a as expanded. FIG. 2 (a) is an expanded sectional view of the first metal pattern 11a in FIG. 1, and FIG. 2(b) is an expanded cross-sectional view taken on line X—X in FIG. 1 of the first metal pattern 11a formed inside the contact hole 9b in FIG. 1.

The first metal patterns 11a to be electrically connected with the ferroelectric capacitor 7 and the transistor 2, respectively, comprise an adhesion layer 21 made up of a TiN layer or a laminated film of a Ti layer and a TiN layer, and a wiring layer 22 formed on top of the adhesion layer 21. The wiring layer 22 is made up of a layer composed mainly of Al or a layer composed mainly of W, and the first metal pattern 11a is formed by patterning after forming the adhesion layer 21 and the wiring layer 22 in that order. That is, as shown in FIG. 2(a), the first metal pattern 11a is constructed such that the wiring layer 22 poses a risk of the side face thereof, in particular, coming in contact with water constituents and the wiring layer 22 susceptible to oxidation is exposed.

Accordingly, with the semiconductor device according to the invention, on the top face and the side face of the first metal pattern 11a comprised of the adhesion layer 21 and the wiring layer 22, the first protection film 12 that has capability of preventing diffusion of water constituents and is formed to a substantially identical thickness on both the top face and the side face of the first metal pattern 11a, in other words, the first protection film 12 having a high coating power is formed to a thickness in the order of about 50 to 200 nm.

With such a constitution as described being adopted, it becomes possible to ensure prevention of the side face of the first metal pattern 11a from coming in contact with water constituents, which can not be fully attained by the agency of a water constituents diffusion preventive film 8 that is formed by a sputtering method and so forth after the formation of the first protection film 12 since it is difficult to form a film to a sufficient thickness on the side face of the first metal pattern 11a by the sputtering method. As a result, evolution of hydrogen molecules following thermal diffusion of water constituents can be suppressed.

Further, in the case of using a film such as an $Al_2O_3$ film as the first protection film 12, since the first protection film 12 has high capability of oxidation resistance besides the capability of preventing diffusion of water constituents, it is possible to prevent with greater certainty oxidation of the surface of the metal patterns that is caused by thermal diffusion of water constituents such as constitution water and adsorption water, contained in the interlayer insulators, by providing the first protection film 12 on the top face and the side face of the first metal pattern 11a inside the contact hole 9b, including a surface of the first metal pattern 11a. As a result, reduction in the number of hydrogen molecules as evolved due to oxidation of the metal patterns can be realized.

Further, with the semiconductor device according to the invention, a silicon nitride film serving as the water constituents diffusion preventive film 8 for preventing water constituents from diffusing into the surface of the first metal pattern 11a is formed on the first protection film 12 to a thickness in the order of about 40 to 200 nm by the reactive sputtering method and so forth, not requiring a hydrogen atmosphere.

Thus, by providing the water constituents diffusion preventive film 8 for prevention of diffusion of water constituents on top of the first protection film 12 for prevention of oxidation of the surface of the first metal pattern 11a, it becomes possible to prevent arrival of water constituents at the surface of the first metal pattern 11, so that further reduction in the number of hydrogen molecules as evolved due to oxidation of the metal patterns can be achieved.

Also, with the semiconductor device according to the invention, by adopting a construction such that the water constituents diffusion preventive film 8 is provided on the second interlayer insulator 4, it becomes possible to effectively prevent water constituents as evolved during a fabrication process including a back-end step of forming the passivation film 6, and so forth, from being diffused to the ferroelectric capacitor 7 installed in the second interlayer insulator 4.

The water constituents diffusion preventive film 8 is preferably formed at least on the second interlayer insulator 4 in order to suppress the impact of water constituents on the ferroelectric capacitor 7, and in particular, is preferably formed such a way as to incorporate the first metal pattern 11a as patterned and the first protection film 12 formed on top of the first metal pattern 11a.

Further, by forming the Water constituents diffusion preventive film 8 to a thickness in the order of about 40 to 160 nm, it becomes possible to protect the ferroelectric capacitor 7 from water constituents contained in the third interlayer insulator 5 and water constituents as evolved in the course of the fabrication process.

The water constituents diffusion preventive film 8 is preferably made up of a silicon nitride film ($Si_xN_x$ film) or an oxidized silicon nitride film (SiON film), formed by the reactive sputtering method that requires no hydrogen atmosphere, in order to lessen the impact of hydrogen during fabrication in consideration of corrosion resistance against water constituents, and heat resistance encountered in various methods of fabrication.

For other layers and elements, the conventional and well-known materials can be employed.

For the semiconductor substrate 1, a silicon (Si) substrate can be employed, and for the first, second, and third interlayer insulators 3, 4, 5, a silicon oxide film ($SiO_2$ film), and so forth, formed by, for example, the CVD method, can be employed. And for the passivation film 6, a silicon nitride film, and so forth, formed by the CVD method, can be employed.

Further, with the semiconductor device according to the invention, a hydrogen diffusion preventive film 31 for prevention of hydrogen diffusion may be formed on top of the water constituents diffusion preventive film 8 to a thickness in the order of about 50 to 200 nm as shown in FIG. 3. By forming the hydrogen diffusion preventive film 31, the impact of hydrogen on the ferroelectric capacitor 7 can be rendered less even at the time of the formation of the passivation film 6 to be performed under a hydrogen atmosphere.

The hydrogen diffusion preventive film 31 need only be formed at least underneath the passivation film 6, and is preferably formed over the first protection film 12 or the first metal pattern 11a. In particular, if the hydrogen diffusion preventive film 31 is formed immediately before the formation of the passivation film 6, this will prevent the hydrogen diffusion preventive film 31 from being exposed to an atmosphere of hydrogen evolved when forming the interlayer insulators and so forth by use of a plasma, thereby enabling a high hydrogen barrier characteristic to be maintained. For the hydrogen diffusion preventive film 31 according the present embodiment, use of tantalum oxide ($Ta_2O_5$), aluminum oxide ($Al_2O_3$), and so forth is preferable and particularly from the viewpoint of workability, use of tantalum oxide for the hydrogen diffusion preventive film 31 is preferable.

Further, as shown in FIG. 4, the semiconductor device according to the present embodiment may be constructed such that after depositing the first protection film 12 on the top and side faces of the first metal pattern 11a, a portion of the first protection film 12, on the top face of the first metal pattern 11a, is removed by etching to thereby form a sidewall 12a made up of the first protection film 12 on the side face of the first metal pattern 11a, and a water constituents diffusion preventive film 8 for prevention of diffusion of water constituents is formed on the sidewall 12a and the first metal pattern 11a. With such a constitution described as above, however, the wiring layer 22 susceptible to oxidation will be exposed on the top face of the first metal pattern 11a, and accordingly, the first metal pattern 11a preferably has a multilayered construction comprising the wiring layer 22 and a protective layer 23 for preventing oxidation of the wiring layer 22, formed on top of the wiring layer 22.

A layer serving as the protective layer 23 of the first metal pattern 11a is selected in consideration of adhesiveness, and so forth, with the wiring layer 22, and a layer made up of a TiN layer, or a laminated layer of a Ti layer and a TiN layer, and so forth is preferably used as the protective layer 23.

With the semiconductor device comprising the sidewall 12a of the first protection film 12, it becomes possible to prevent with certainty short circuit which is likely to occur between the adjacent first metal patterns 11a owing to the first protection film 12 formed so as to span across a plurality of the first metal patterns 11a in the case of, for example, insufficient introduction of oxygen or insufficient reaction of constituent metals with oxygen in the step of forming the first protection film 12 such the TiO film or the $Al_2O_3$ film formed by the reactive sputtering method as in the case of the semiconductor device shown in FIG. 2.

It also becomes possible to prevent with certainty short circuit which is likely to occur in the case where there occur progress in reduction of the first protection film 12 and a drop in electric resistance thereof in the later steps of a process of fabricating the semiconductor device.

Further, if the first protection film 12 is rendered into the shape of the sidewall 12a around the first metal pattern 11a, this will enable an angle of the bent corners of the first metal pattern 11a to be moderated, so that a coating ratio of a film formed after the first protection film 12 can be improved.

In particular, as for the water constituents diffusion preventive film 8 formed on the first protection film 12, since a silicon nitride film formed by the reactive sputtering method that is hard to be deposited on the sidewall is used as the water constituents diffusion preventive film 8, an angle formed between the top face and side face of the first metal pattern 11a is moderated by the tapered face of the first protection film provided on the side face of the first metal pattern 11a, thereby enabling the coating ratio to be further improved. In addition, it becomes possible to secure a sufficient thickness of the water constituents diffusion preventive film 8 also on the side face of the first metal pattern 11a, thereby enhancing capability of preventing water constituents from coming into contact with the first metal pattern 11a.

On the assumption that, for example, a thickness of the first metal pattern 11a is in the order of about 300 to 500 nm, and a thickness of the sidewall 12a is in the order of about 200 nm, an angle $\theta$ formed between the tapered face of the sidewall 12a of the first protection film 12, formed on the side face of the first metal pattern 11a, and the top face of the first metal pattern 11a will be about 70°, thereby enabling the coating ratio of the water constituents diffusion preventive film 8 to be improved by a factor of not less than about 1.6 in comparison with the same in the case where an angle $\theta$ between the first protection film 12, not formed in the shape of the sidewall 12a, and the top face of the first metal pattern 11a is about 90°.

Further, with the semiconductor device comprising the first protection film 12 in the shape of the sidewall 12a, a hydrogen diffusion preventive film 31 may be formed on the water constituents diffusion preventive film 8 as shown in FIG. 3.

A method of fabricating the semiconductor device according to the first embodiment of the invention, shown in Fig, 1, is described hereinafter.

First, the transistor 2 comprising the source region 2a, drain region 2b, and gate electrode 2c is formed on a Si substrate as the semiconductor substrate 1 by the well-known method.

Thereafter, the first interlayer insulator 3 made up of a silicon oxide film is formed on the semiconductor substrate 1 incorporating the transistor 2 by the well-known CVD method and so forth.

Subsequently, the ferroelectric capacitor 7 comprising the lower electrode 7a, the upper electrode 7b, made of noble metal, such as Pt and so forth, and the ferroelectric film 7c made up of a metal oxide film is formed on the first interlayer insulator 3 before forming the second interlayer insulator 4 on top of the first interlayer insulator 3 with the ferroelectric capacitor 7 formed thereon.

After the formation of the second interlayer insulator 4, heat treatment at a temperature in a range of 700 to 800° C. is applied thereto for 1 to 2 hours to thereby remove water constituents (OH compounds) such as constitution water contained in the first, and second interlayer insulators 3, 4. There is no particular limitation to an atmosphere under which the heat treatment described above is to be applied unless it is a reducing atmosphere, however, from the viewpoint of making up for oxygen deficiency in the ferroelectric film 7c, the heat treatment is preferably applied under an oxygen atmosphere.

Subsequently, a resist mask having openings is formed on the second interlayer insulator 4, and the contact hole 9a reaching the transistor 2 is formed in the first interlayer insulator 3, and the second interlayer insulator 4, and the contact hole 9b reaching the electrodes of the ferroelectric capacitor 7 is formed in the second interlayer insulator 4, respectively. Then, the first metal pattern 11a for electrical connection with the transistor 2, and the ferroelectric capacitor 7 is formed inside the contact holes 9a, 9b, respectively. In forming the first metal pattern 11a, a TiN film to serve as the adhesion layer 21 is first formed to a thickness in the order of about 100 nm. Subsequently, for example, an Al film to serve as the wiring layer 22 is sequentially formed to a thickness in the order of about 300 nm by the sputtering method and is then etched into a pattern as desired. As a result, the first metal patterns 11a are formed.

In this case, the protective layer 23 made up of a TiN film or a laminated film composed of Ti and TiN for protecting the top face of the wiring layer 22 from oxidation may be formed on top of the wiring layer 22 prior to a step of patterning.

After the formation of the first metal pattern 11a, the first protection film 12 for preventing diffusion of water constituents is formed on the top face and side face of the respective first metal patterns 11a by a film-forming method having excellent coating performance such as a CVD method, and so forth. For the first protection film 12 according to the present embodiment, use is made of an $Al_2O_3$ film and so forth, formed by the well-known CVD method. As the first protection film 12, use is preferably made of a film that does not cause evolution of hydrogen when the film is formed, does not contain water constituents therein, and can be formed with an excellent coating power. Further, the first protection film 12 is preferably a film not only having capability of preventing diffusion of water constituents but also more insusceptible to oxidation than the constituent material of the first metal pattern 11a, and highly insulating. The film need only be formed to a thickness in the order of about 50 to 200 nm.

Thereafter, a $Si_3N_4$ film serving as the water constituents diffusion preventive film 8 is formed to a thickness in the order of about 100 nm by use of a reactive sputtering system (manufactured by Shinko Seiki Co., Ltd.).

With the present invention, in forming the water constituents diffusion preventive film 8 that is effective in prevention of the impact of water constituents, the reactive sputtering method is adopted, so that the water constituents diffusion preventive film 8 can be formed in a condition where an amount of hydrogen and nitrogen that have strong effects on deterioration of the characteristic of the ferroelectric capacitor will be remarkably decreased as compared with the case of forming the film by the CVD method.

Now, the reactive sputtering method is a technique for forming a thin film made of a metal compound on a substrate by introducing a rare gas into a film-forming enclosure (sputter chamber) where the substrate and a sputter target are disposed, causing plasma discharge to occur by applying a negative high voltage to a sputter electrode (cathode) with the target attached thereto, thereby sputtering the target by the agency of a rare gas plasma, and simultaneously introducing an active gas, for example, a nitrogen ($N_2$) gas so as to cause reaction between the active gas and the constituent material of the target.

As for the conditions under which the reactive sputtering method is applied, it is preferably applied under an atmosphere of a mixed gas of a nitrogen gas, and so forth, as the active gas, and an argon gas, and so forth, as the rare gas, mixed approximately at a ratio of 1:1; and at a pressure in a range of 0.04 to 0.15 Pa, with an RF power source being in the order of 1 to 3 kW.

Accordingly, with the method according to the invention, a sputtering condition for the formation of the water constituents diffusion preventive film 8 is adopted such that a Si target is used, an Ar gas and a $N_2$ gas are introduced at a low rate of 1:1, and at a pressure of 1330 Mpa (10 mTorr) with an RF power source at 2.5 kW.

After the formation of the water constituents diffusion preventive film 8, a $SiO_2$ film as the third interlayer insulator 5 is further formed on top of the water constituents diffusion preventive film 8 to a thickness in the order of about 400 nm by the well-known CVD method. Thereafter, a resist mask having openings are formed on top of the third interlayer insulator 5, and a through-hole 10 reaching the first metal pattern 11a is formed in the third interlayer insulator 5 by use of the resist mask. Inside the through-hole 10 thus formed, there is formed a second metal pattern 11b for electrically connecting peripheral circuits with a ferroelectric memory cell comprised of the transistor 2 and the ferroelectric capacitor 7. The second metal pattern 11b is formed of Al (thickness: 700 nm) and TiN (thickness: 100 nm) by the sputtering method, and subsequently, is patterned into a pattern as desired.

Finally, a $Si_3N_4$ film to serve as the passivation film 6 is formed to a thickness about 850 nm by the CVD method, thereby fabricating the semiconductor device according to the invention, comprising the ferroelectric memory.

In the case where the first metal pattern 11a is provided with the protective layer 23, after the formation of the first protection film 12 on the top and side faces of the first metal pattern 11a, a step of etching back the entire surface of the first protection film 12, and forming the sidewall 12a of the first protection film 12 on the side face of the first metal pattern 11a may be added before forming the water constituents diffusion preventive film 8 of the $Si_3N_4$ film which is be formed by the reactive sputtering method.

By forming the sidewall 12a in the step described, the angle of the bent corners of the first metal pattern 11a can be moderated, thereby enabling the coating ratio of the water constituents diffusion preventive film 8, and so forth, covering the first metal pattern 11a, to be enhanced.

Further, with the method of fabricating the semiconductor device according to the present embodiment, after the formation of the first metal pattern 11a for electrically interconnecting the transistor 2 and the ferroelectric capacitor 7, a hydrogen diffusion preventive film 41 made up of a $Ta_2O_5$ film, and so forth, effective in prevention of the impact of hydrogen, may be similarly formed on the first metal pattern 11a to a thickness in the order of about 170 nm by the reactive sputtering method. As for sputtering conditions for forming the hydrogen diffusion preventive film 41, the conditions are adopted such that the film is formed by using a Ta target, and introducing an Ar gas and an $O_2$ gas into a sputtering chamber at a flow ratio of 1:1 at a pressure of 1330 mPa (10 mTorr), with an RF power source at 2.5 kW.

As with the present embodiment described above, by providing the first protection film 12 on the first metal pattern 11a, and providing further the water constituents diffusion preventive film 8 formed by the reactive sputtering method, and so forth, on top of the first protection film 12, it becomes possible to prevent thermal diffusion of water constituents into the first metal pattern 11a from the films containing an abundance of constitution water, such as the third interlayer insulator 5 made of a silicon oxide film, silicon nitride film, and so forth, or the passivation film, which are formed in the steps after the formation of the first metal pattern 11a during the process of fabricating the semiconductor device. Furthermore, even if there occurs thermal diffusion of water constituents into the first metal pattern 11a, oxidation of the constituent material of the first metal pattern 11a, such as Al, W, and Ti, by the agency of water constituents can be suppressed because the wiring layer 22 of the first metal pattern 11a, very susceptible to oxidation, is covered by the first protection film 12 whose energy for bonding with oxygen is sufficiently low. As a result, it becomes possible to reduce evolution of hydrogen molecules, accompanying oxidation of the first and second metal patterns 11a, 11b.

That is, it becomes possible to provide the method of fabricating the semiconductor device capable of maintaining satisfactory ferroelectricity and ferroelectric capacitor characteristics as a ferroelectric memory.

Further, as a result of adoption of the construction in which the first protection film 12 in the shape of a sidewall is provided on the side face of the first metal patterns 11a, the angle of the bent corners of the first metal patterns 11a can be moderated. Accordingly, evolution of hydrogen and nitrogen, adversely affecting the ferroelectric capacitor, can be suppressed, and, in addition, even in the case of using the reactive sputtering method by which a film can be formed at a low temperature, the water constituents diffusion preventive film 8 with a sufficiently large thickness secured can be formed on the side face of the first metal patterns 11a, respectively.

Thus, according to the present embodiment of the invention, it is possible to further enhance capability for preventing water constituents from contacting the first metal patterns 11a, so that a semiconductor device capable of maintaining more satisfactory ferroelectricity and ferroelectric capacitor characteristics as a ferroelectric memory can be fabricated.

Next, a second embodiment of a method of fabricating a semiconductor device according to the invention is described hereinafter.

Figure 5A:
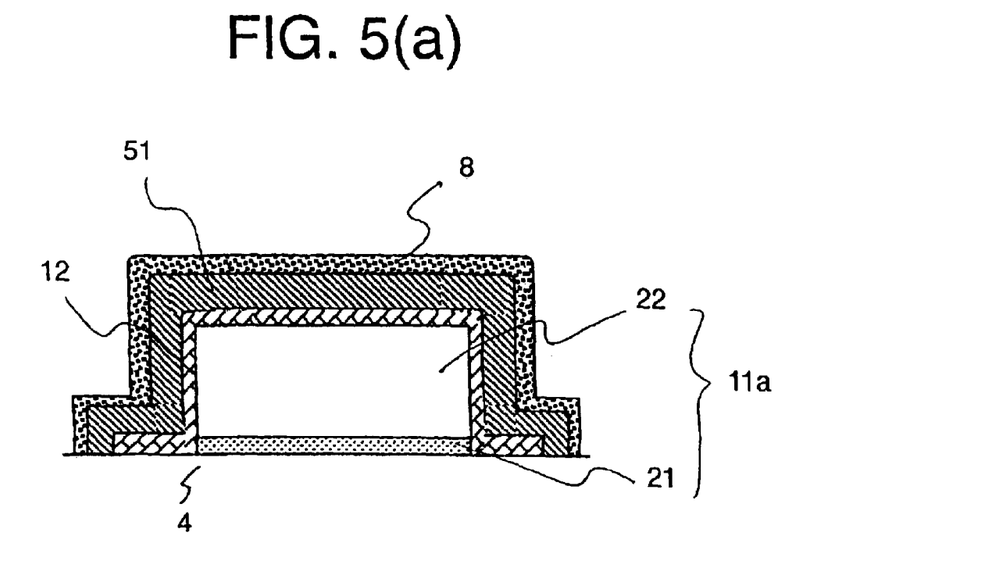
FIG. 5 is an expanded view of a metal pattern of a semiconductor device fabricated according to a second embodiment of the invention.
Figure 5B:
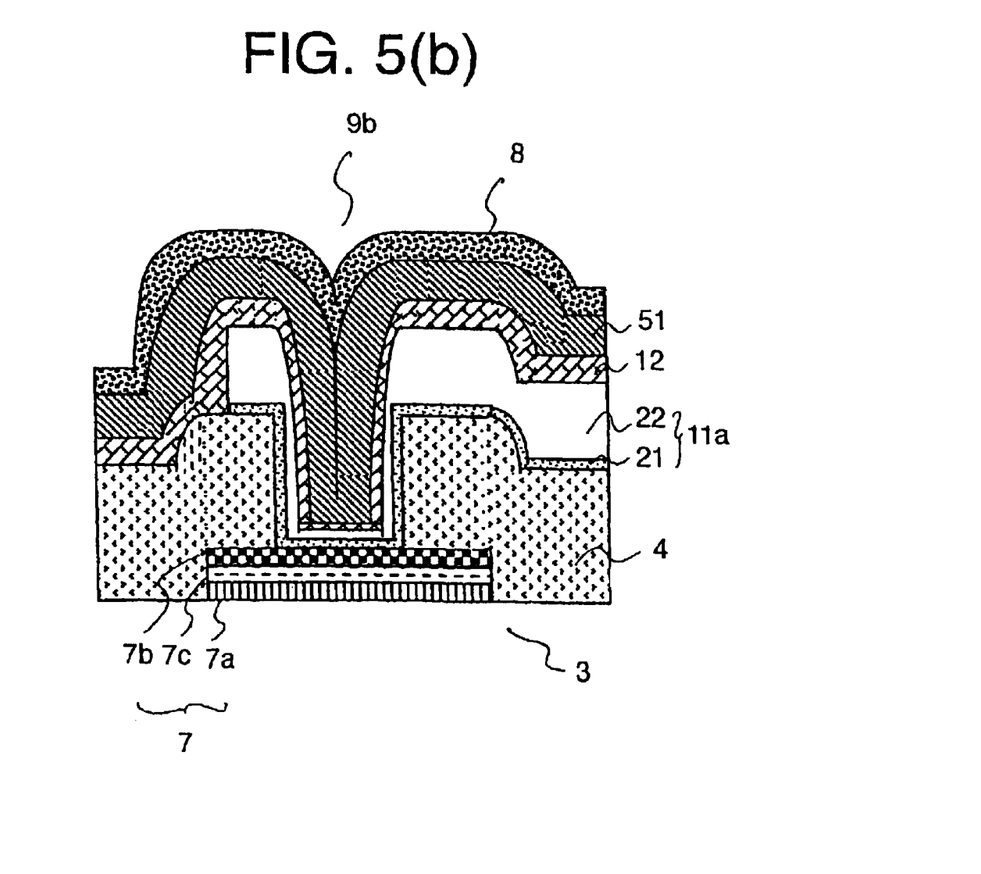

FIGS. 5(a) and 5(b) are views showing the method of fabricating the semiconductor device according to the second embodiment, FIG. 5(a) is an expanded sectional view of the first metal pattern 11a in FIG. 1, and FIG. 5(b) is an expanded cross-sectional view taken on line X—X in FIG. 1 of the first metal pattern 11a formed inside the contact hole 9b in FIG. 1. In these figures, parts identical to, or corresponding to those shown in the first embodiment are denoted by like reference numerals.

The method of fabricating the semiconductor device according to the second embodiment differs from that according to the first embodiment in that a water constituents diffusion preventive film 8 to be formed on the first metal pattern 11a is provided through the intermediary of a silicon oxide film 51 that is not prone to evolution of hydrogen at the time of film formation and has low water constituent content, composed mainly of material such as, for example, tetraethyl orthosilicate (TEOS).

The construction of the semiconductor device according to the second embodiment is described hereinafter.

As shown in FIG. 5, as with the previously described semiconductor device according to the first embodiment, the semiconductor device according to the second embodiment is constructed such that the first metal pattern 11a comprising an adhesion layer 21 made up of a TiN layer or a laminated film of a Ti layer and a TiN layer, and a wiring layer 22 formed on top of the adhesion layer 21 can be electrically connected with a ferroelectric capacitor 7 and a transistor 2.

Subsequently, on the top and side faces of the first metal pattern 11a, a TiO film, an $Al_2O_3$ film, and so forth, serving as a first protection film 12, is formed to a thickness in the order of about 50 to 200 nm.

With the semiconductor device according to the second embodiment, after the formation of the first protection film 12, the silicon oxide film 51 that is not prone to evolution of hydrogen at the time of film formation and has low water constituent content, composed mainly of material such as, for example, tetraethyl orthosilicate (TEOS), is formed on top of the first protection film 12 and the first metal pattern 11a. Further, in the case of using a metal having a high melting point such as TiN, and so forth, as the constituent material of the first metal pattern 11a, it is possible to form a film having still lower water constituent content by using a silicon oxide film composed mainly of TEOS, formed particularly under a reduced pressure, for example, at, for example, not higher than about 0.3 Torr.

Now, the water constituents referred to herein includes surface adsorption water ($H_2O$), constitution water (Si—OH and Si—OH combined with a OH group through hydrogen bond that severs bond with Si when heated, producing $H_2O$), and so forth. Thus, a contact hole 9b is filled up with the first metal pattern 11a that is formed inside the contact hole 9b and the insulating film 51 whose water constituent content is low. Accordingly, a thickness of the silicon oxide film 51 formed on the first metal pattern 11a is preferably not less than about half the inside diameter of the contact hole 9b so as to enable the interior of the contact hole 9b to be filled up with the silicon oxide film 51.

Then, after the formation of the silicon oxide film 51, a water constituents diffusion preventive film 8 is formed on the silicon oxide film 51 by the sputtering method and so forth.

With the present embodiment, by forming the film, not prone to evolution of hydrogen at the time of film formation, and having low water constituent content, inside the hole beforehand, it becomes possible to form the water constituents diffusion preventive film 8 capable of enhancing a coating ratio and sufficiently preventing diffusion of water constituents even along the sidewall of the contact hole 9b where it is difficult to secure a sufficient thickness of the water constituents diffusion preventive film 8 to be formed by the sputtering method.

Needless to say, as with the previously described semiconductor device according to the first embodiment, after the formation of the water constituents diffusion preventive film 8, a hydrogen diffusion preventive film 41 made up of a $Ta_2O_5$ film, and so forth, for prevention of diffusion of hydrogen into a ferroelectric capacitor, may be similarly formed on the water constituents diffusion preventive film 8 to a thickness in the order of about 170 nm by the reactive sputtering method.

Thus, by providing the water constituents diffusion preventive film 8 through the intermediary of the silicon oxide film 51, the water constituents diffusion preventive film 8 having a sufficiently large thickness can be deposited, and in particular, it becomes possible to prevent deterioration in the capability of the water constituents diffusion preventive film 8 for preventing diffusion of water constituents inside the contact hole 9b, caused by a portion of the water constituents diffusion preventive film 8, having a smaller thickness, along the sidewall of the contact hole 9b.

As described hereinbefore, with the method of fabricating the semiconductor device according to the invention wherein the surface of the metal patterns susceptible to oxidation is coated with the first protection film, and the water constituents diffusion preventive film is formed on the first protection film by the reactive sputtering method, and so forth, it becomes possible to reduce evolution of hydrogen molecules, accompanying oxidation of the surface of the metal patterns, which is caused by the water constituents contained in the interlayer insulators and so forth, and also to suppress evolution of hydrogen atoms, caused by the catalytic action of the electrodes made of a noble metal such as platinum, and so forth. That is, it is possible to protect the ferroelectric capacitor from the water constituents that are evolved during the fabrication process, thereby providing the ferroelectric capacitor maintaining satisfactory memory characteristics. Also, since the water constituents diffusion preventive film having a sufficiently large thickness can be provided, it becomes possible to provide a ferroelectric memory capable of reducing the impact of hydrogen evolved when forming the passivation film, and so forth that are to be formed in a hydrogen atmosphere.

Further, with the semiconductor device fabricated according to the present embodiment as well, a constitution may be adopted such that a sidewall 12a of the first protection film 12 is provided as with the case of the first embodiment. In such a case, it becomes possible to prevent with certainty short circuit which is likely to occur between the adjacent first metal patterns 11a owing to the first protection film 12 formed so as to span across a plurality of the first metal patterns 11a, in the case of, for example, insufficient introduction of oxygen or insufficient reaction of constituent metals with oxygen occurring in the step of forming the first protection film 12 such a TiO film and $Al_2O_3$ film by the reactive sputtering method.

Further, it also becomes possible to prevent with certainty short circuit which is likely to occur in the case where there occur progress in reduction of the first protection film 12 and a drop in electric resistance thereof in the later steps of the process of fabricating the semiconductor device.

Further, if the first protection film 12 is formed in the shape of the sidewall 12a around the first metal pattern 11a, an angle of the bent corners of the first metal pattern 11a can be moderated, so that a coating ratio of films formed after the first protection film 12 can be improved, and since a sufficiently large thickness of the water constituents diffusion preventive film 8 can be secured even along the side face of the first metal pattern 11a, the capability thereof for preventing water constituents from coming in contact with the first metal pattern 11a can be enhanced.

What is claimed is:

1. A semiconductor device comprising:
   a semiconductor substrate;

a capacitor having a lower electrode formed on the semiconductor substrate, a metal oxide insulator film formed on the lower electrode, and an upper electrode formed on the metal oxide insulator film;

a metal pattern electrically connected to at least one of the upper and lower electrodes of the capacitor;

a water constituents diffusion preventive film formed on a side face and a top face of the metal pattern so as to cover the metal pattern; and a first protective film provided between the side face of the metal pattern and the water constituents diffusion preventive film.

2. A semiconductor device according to claim 1, wherein the first protective film prevents diffusion of water constituents, and oxidation of the metal pattern.

3. A semiconductor device according to claim 1, wherein the first protective film is a highly insulating and passivated metal oxide film.

4. A semiconductor device according to claim 1, wherein the metal pattern comprises a conductive layer electrically connected to the capacitor and a protective layer which protects a top face of the conductive layer, and wherein the protective layer is exposed by the first protective film, and the side face of the metal pattern is covered with the first protective film.

5. A semiconductor device according to claim 4, wherein a tapered surface is formed on the side face of the first protective film, and an angle between the tapered surface and the top face of the conductive layer is not greater than about 70°.

6. A semiconductor device according to claim 1, wherein the water constituents diffusion preventive film is formed by a reactive sputtering method.

7. A semiconductor device according to claim 6, wherein the water constituents diffusion preventive film is a silicon nitride film or a silicon oxynitriding film.

8. A semiconductor device according to claim 1, further comprising a water constituents diffusion preventive film formed on the first protective film or the metal pattern.

9. A semiconductor device comprising:

a semiconductor substrate;

a capacitor having a lower electrode formed on the semiconductor substrate, a metal oxide insulator film formed on the lower electrode, and an upper electrode formed on the metal oxide insulator film;

an interlayer insulator formed on the capacitor and the semiconductor substrate;

a hole formed in the interlayer insulator so as to expose a top face of at least one of the upper and lower electrodes of the capacitor;

a metal pattern formed in the hole which is electrically connected to the at least one of the upper and lower electrodes of the capacitor;

a insulating film having a low water constituent content and formed on the metal pattern inside the hole; and a water constituents diffusion preventive film provided on the metal pattern or the insulating film having the low water constituent content.

10. A semiconductor device according to claim 9, wherein the sum of a thickness of the metal pattern inside the hole and a thickness of the insulating film having the low water constituent contents, inside the hole, as measured from a bottom face of the hole, is substantially equivalent to not less than a thickness of the interlayer insulator.

11. A semiconductor device according to claim 9, wherein the insulating film having the lower water constituent contents is a silicon oxide film, and is formed by a chemical vapor deposition method using a gas containing an organic silicon compound.

12. A semiconductor device according to claim 9, wherein the insulating film having the low water constitute contents has a thickness substantially equivalent to not less than half of the inside diameter of the hole.

13. A semiconductor device according to claim 9, further comprising a first protective film formed on the metal pattern inside the hole, wherein the first protective film and the insulating film having the low water constitute contents are formed in the hole.

14. A semiconductor device according to claim 9, wherein the metal pattern has a conductive layer electrically connected to the capacitor and a protective layer which protects the top face of the conductive layer, and wherein the protective layer is exposed by the first protective film, and the side face of the metal pattern is covered with the first protective film.

15. A semiconductor device according to claim 9, wherein the water constituents diffusion preventive film is formed by a reactive sputtering method.

16. A semiconductor device according to claim 15, wherein the water constituents diffusion preventive film is a silicon nitride film or a silicon oxynitriding film.

17. A semiconductor device according to claim 9 further comprising a water constituents diffusion preventive film formed on the first protective film or metal pattern.

* * * * *